United States Patent
Chen et al.

(10) Patent No.: US 10,204,883 B2
(45) Date of Patent: Feb. 12, 2019

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Hsien-Wei Chen, Hsinchu (TW); Jie Chen, New Taipei (TW)

(73) Assignee: TAIWAN SEMIDONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/013,700

(22) Filed: Feb. 2, 2016

(65) Prior Publication Data

US 2017/0221859 A1    Aug. 3, 2017

(51) Int. Cl.
*H01L 25/065*  (2006.01)
*H01L 21/78*   (2006.01)
*H01L 25/00*   (2006.01)
*H01L 21/56*   (2006.01)
*H01L 23/552*  (2006.01)
(Continued)

(52) U.S. Cl.
CPC ........ *H01L 25/0657* (2013.01); *H01L 21/561* (2013.01); *H01L 21/78* (2013.01); *H01L 23/552* (2013.01); *H01L 24/20* (2013.01); *H01L 25/105* (2013.01); *H01L 25/50* (2013.01); *H01L 24/19* (2013.01); *H01L 2224/04105* (2013.01); *H01L 2224/12105* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2225/0651* (2013.01); *H01L 2225/0652* (2013.01); *H01L 2225/06537* (2013.01); *H01L 2225/06548* (2013.01); *H01L 2225/06568* (2013.01); *H01L 2225/06582* (2013.01); *H01L 2225/06593* (2013.01); *H01L 2225/1035* (2013.01); *H01L 2225/1041* (2013.01); *H01L 2225/1058* (2013.01); *H01L 2924/14* (2013.01);
(Continued)

(58) Field of Classification Search
None
See application file for complete search history.

(56) References Cited

U.S. PATENT DOCUMENTS 7,187,071 B2 * 3/2007 Tsuneoka ............... H01L 24/97
257/207
7,261,596 B2 * 8/2007 Akaike ................ H01L 23/552
439/607.01

(Continued)

*Primary Examiner* — Andres Munoz
(74) *Attorney, Agent, or Firm* — WPAT, P.C., Intellectual Property Attorneys; Anthony King (57) ABSTRACT

A semiconductor device includes a semiconductor die, an insulative layer, a conductive feature and a shield. The insulative layer surrounds the semiconductor die, and the insulative layer has a first surface and a second surface opposite to each other. The conductive feature is extended from the first surface to be proximal to the second surface of the insulative layer, and the conductive feature has a first end exposed by the first surface of the insulative layer. The shield covers the first surface of the insulative layer and is grounded through the first end of the conductive feature exposed by the first surface of the insulative layer.

20 Claims, 11 Drawing Sheets

(51) Int. Cl.
  *H01L 23/00* (2006.01)
  *H01L 25/10* (2006.01)
(52) U.S. Cl.
  CPC .............. *H01L 2924/1815* (2013.01); *H01L 2924/3025* (2013.01)

(56) References Cited

U.S. PATENT DOCUMENTS

| | | | | |
|---|---|---|---|---|
| 7,633,765 | B1* | 12/2009 | Scanlan | H01L 21/4857 174/262 |
| 8,018,034 | B2* | 9/2011 | Chi | H01L 23/29 257/660 |
| 8,269,342 | B2* | 9/2012 | Kim | H01L 23/3128 257/706 |
| 8,296,941 | B2* | 10/2012 | Hiner | H01L 23/552 257/660 |
| 8,654,537 | B2* | 2/2014 | Fisher, Jr. | H05K 3/284 174/394 |
| 8,766,429 | B2* | 7/2014 | Kim | H01L 25/105 257/659 |
| 9,337,073 | B2* | 5/2016 | Liu | H01L 25/50 |
| 2004/0063246 | A1* | 4/2004 | Karnezos | H01L 23/3128 438/108 |
| 2006/0113642 | A1* | 6/2006 | Kajiki | H01L 21/565 257/659 |
| 2006/0274517 | A1* | 12/2006 | Coffy | H01L 21/561 361/816 |
| 2009/0315156 | A1* | 12/2009 | Harper | H01L 23/552 257/660 |
| 2010/0133534 | A1* | 6/2010 | Do | H01L 21/563 257/48 |
| 2011/0304015 | A1* | 12/2011 | Kim | H01L 23/552 257/532 |
| 2012/0119346 | A1* | 5/2012 | Im | H01L 21/563 257/690 |
| 2012/0320559 | A1* | 12/2012 | Kimura | H01L 23/552 361/818 |
| 2013/0257462 | A1* | 10/2013 | Ding | G01R 1/0433 324/705 |
| 2014/0111949 | A1* | 4/2014 | Gao | H05K 9/0045 361/729 |
| 2014/0262475 | A1* | 9/2014 | Liu | H01L 23/5389 174/377 |
| 2017/0110413 | A1* | 4/2017 | Chen | H01L 21/3205 |
| 2017/0256502 | A1* | 9/2017 | Chen | H01L 21/3205 |
| 2017/0317038 | A1* | 11/2017 | Tsai | H01L 23/60 |
| 2018/0151540 | A1* | 5/2018 | Yu | H01L 21/561 |

\* cited by examiner

SEMICONDUCTOR DEVICE AND MANUFACTURING METHOD THEREOF

BACKGROUND

Presently, the electronic equipment is indispensable from our daily life, which involves and incorporates with many electronic components. In an electronic industry, the electronic components consisting dies are widely adopted in various electronic equipment and applications. As the electronic industry progresses, a miniaturization and higher functions of the electronic components are increasingly emphasized. The demands on miniaturization and higher functions of the electronic components result in more complicated and denser configuration.

The major trend in the electronic industry is to make the electronic components lighter, smaller, more multifunctional, more powerful, more reliable and less expensive. Thus, a wafer level packaging (WLP) technology has been gaining in popularity. This technology provides a manufacturing of the electronic components at a wafer level, and is widely applied in order to meet continuous demands toward the miniaturization and higher functions of the electronic components.

As the applications and complexity of the wafer level packages increase, there are more challenges to the reliability and stability. As such, improvements in the structure and method for a WLP continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

In the present disclosure, a three dimensional (3D) semiconductor package is formed to have at least two semiconductor dies stacked in a direction (also called stacking direction) along the thickness of each individual die. The 3D semiconductor package can be formed by utilizing a fan-in or fan-out wafer level package technology. A conductive structure is disposed between the stacked dies. For a conductive structure which provides electrical communication for any of the dies in the 3D semiconductor package, is called active component such as "active redistribution layer (active RDL)", "active conductive post", "active conductive pad" or "active through insulation via (active TIV)" in the present disclosure. However, for a conductive structure that does not provide intra-communication between the stack dies or inter-communication between the 3D semiconductor package and other external device, is called dummy component such as "dummy redistribution layer" (dummy RDL), "dummy conductive pad" or "dummy through insulation via (dummy TIV)" in the present disclosure. An insulative material such as molding or encapsulating is adopted to surround the stacked dies and the conductive structure in order to form an integrated 3D semiconductor package. In some embodiments, the insulative material has at least three layers in which each layer may be formed with a different insulative material. Each of the three layers is designed to substantially surround a die or the RDL. The insulative material protects the die or RDL from undesired electrical contact or foreign contamination. The interface between different insulative layers may be observed with a stained cross sectional view under a micro scope.

In the present disclosure, a conductive feature is disposed in the insulative material and extended upwardly for a determined height. The conductive feature is extended through at least one insulative layer. The conductive feature is configured to be connected with a ground terminal of the 3D semiconductor package. The conductive feature is extended from a first surface to a location which is proximal to a second surface of the insulative layer, wherein the first and second surfaces are opposite to each other. One end of the conductive feature is exposed by the first surface of the insulative layer. In some embodiment, the other end of the conductive feature is exposed by the second surface of the insulative layer. The conductive feature is located in a periphery region of the 3D semiconductor package rather than between the stacked dies. In some embodiments, the conductive feature is not electrically connected with any die in the 3D semiconductor package, i.e. there is no communication between the conductive feature and any of the stacked dies. In some embodiments, the conductive feature is further connected to a dummy RDL and/or a dummy conductive pad.

The 3D semiconductor package also includes a shield for protecting the stacked dies resided inside the shield from an external EMI (Electromagnetic Interference) disturbance. The shield covers an inner molded 3D semiconductor construction (may leave one side opened if necessary). In some embodiments, the shield is in contact with an external surface of the insulative material and electrically connected to the ground terminal of the 3D semiconductor package through the end of the conductive feature exposed by the first surface of the insulative layer.

Figure 1A:
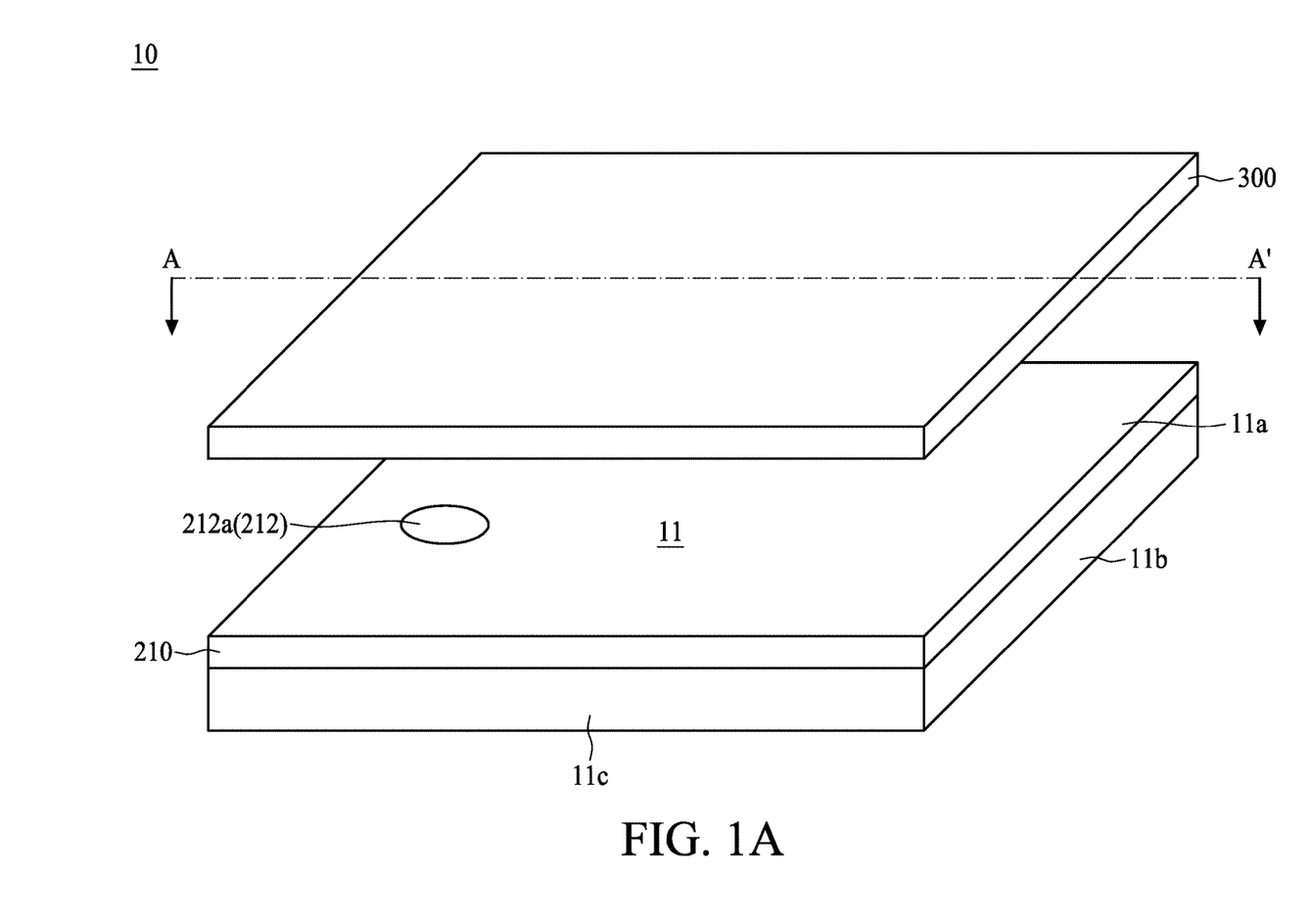
FIG. 1A is a simplified exploded view of some embodiments of an anti-EMI semiconductor device 10.

FIG. 1A is a simplified exploded view of some embodiments of an anti-EMI semiconductor device 10. The semiconductor device 10 may be a 3D semiconductor package and includes a shield 300 to cover a molded construction 11 having at least one semiconductor die resided inside (not shown in the figure). The shield 300 (also referred to as an EMI shield) can prevent or degrade external EMI, which may bring noises to the molded construction 11. In some embodiments, the molded construction 11 has several external surfaces such as 11a, 11b, and 11c being substantially in contact with the internal wall of the shield 300. In some embodiment, the shape of the shield 300 is conformal to some external surfaces of the molded construction 11.

The molded construction 11 also has a conductive feature 212 extended the molded construction 11 in a direction perpendicular to the surface 11a. In some embodiments, the molded construction 11 includes an insulative layer 210, and the external surface 11a may be a first surface (e.g. upper surface) of the insulative layer 210. The conductive feature 212 has a first end 212a exposed by the first surface of the insulative layer 210. The shield 300 is grounded through the first end 212a exposed by the external surface 11a. In some embodiments, the shield 300 is in physical, direct contact with the first end 212a. In some alternative embodiments, the shield 300 is in indirect contact with the first end 212a through another conductive structure (not shown). For example, a conductive interposer is disposed between the shield 300 and first end 212a.

In some embodiments, the semiconductor device 10 may be a logic device such as a Central Processing Unit (CPU), a Micro Control Unit (MCU) or a Graphic Processing Unit (GPU) die, an application specific integrated circuit (ASIC) device such as a mobile application device, a memory device such as a DRAM device, and/or other semiconductor device. The exact functionality of the semiconductor device 10 is not a limitation to the provided subject matter.

Figure 1B:
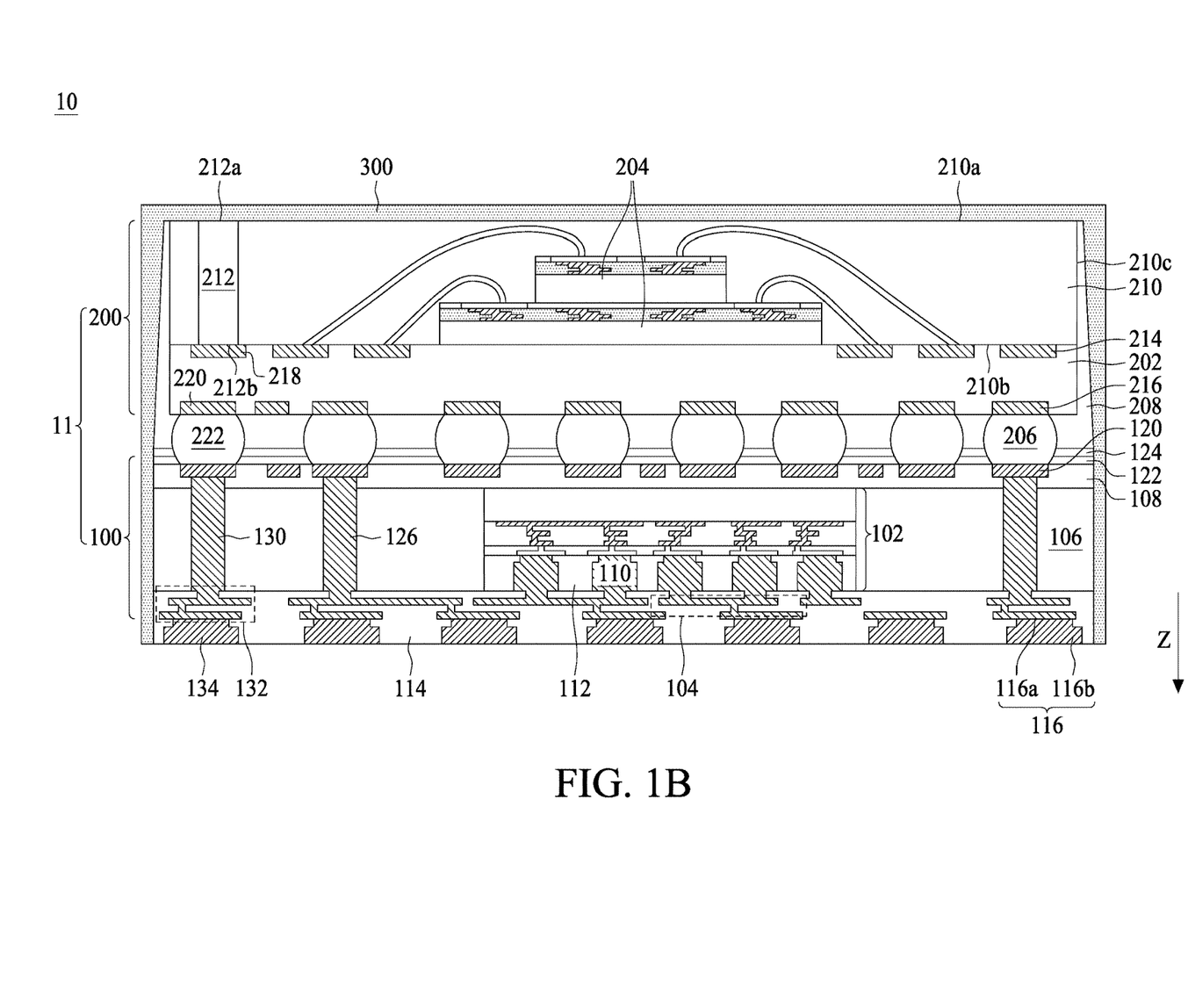
FIG. 1B is a cross-sectional view taken along a line A-A' in FIG. 1A.

FIG. 1B is a cross-sectional view taken along a line A-A' in FIG. 1A. The molded construction 11 is a multi-level structure which has several semiconductor dies or electronic components stacked or arranged in a stacking direction Z to form a 3D semiconductor package. The molded construction 11 includes two semiconductor packages 100, and 200 that are stacked and bonded to each other. In some embodiments, the semiconductor packages 100, and 200 may be preformed, and are then bonded to each other to form a POP (package-on-package) structure, but not limited thereto. In some alternative embodiments, the semiconductor packages 100, and 200 are stacked, and then packaged. The semiconductor package 100 includes semiconductor die(s) (first semiconductor die(s)) 102, with one of the sides (e.g. a front side) of semiconductor die 102 facing down and bonded to active Redistribution Lines (e.g. front-side active RDLs) 104. The semiconductor die 102 may include a semiconductor substrate (not shown), and integrated circuit devices (such as active devices, which may include transistors and/or diodes, for example) at one of the surfaces (e.g. the surface facing down) of the semiconductor substrate. In some embodiments, the semiconductor package 100 is a System-on-Chip (SOC) package. The semiconductor die 102 may be a logic die such as a CPU die, an MCU die, a GPU die, an ASIC die such as a mobile application die, or the like. The exact functionality of the semiconductor die 102 is not a limitation to the provided subject matter.

The semiconductor die 102 is encapsulated (molded) in an insulative layer 106, which surrounds the semiconductor die 102 for protection. The material of the insulative layer 106 may include a molding compound such as resin, epoxy, phenolic hardeners, silicas, catalysts, pigments, mold release agent, polybenzoxazole (PBO), benzocyclobutene (BCB), polyimide, or other suitable molding materials. In some embodiments, the insulative layer 106 is a multilayer structure, which for example includes three stacked insulative films. The material of the upmost and bottommost insulative films may include resin, epoxy, phenolic hardeners, silicas, catalysts, pigments, or mold release agent; and the material of the interposing insulative film may be photosensitive material such as polybenzoxazole (PBO), benzocyclobutene (BCB), polyimide, or the like. In some embodiments, the semiconductor die 102 is adhered to an overlying dielectric layer(s) e.g. a first dielectric layer 108 by, for example, a die-attach film (not shown).

In some embodiments, the semiconductor die 102 includes conductive posts (also referred to as metal pillars) 110 with one ends being connected and bonded to the active RDLs 104. In some exemplary embodiments, the conductive posts 110 are disposed in a dielectric layer(s) 112, which may be a polymer layer and photosensitive. The material of the dielectric layer 112 includes polybenzoxazole (PBO), benzocyclobutene (BCB), polyimide, or the like.

The active RDLs 104 are formed in a second dielectric layer(s) 114. The active RDLs 104 may be formed of a metallic material(s) such as copper, aluminum, nickel, alloys thereof, or multi-layers thereof. In some embodiments, the first dielectric layer 108 and the second dielectric layer 114 include organic materials such as polymers, which may include PBO, BCB, polyimide, or other suitable organic dielectric materials. In alternative embodiments of the present disclosure, the first dielectric layer 108 and the second dielectric layer 114 are formed of inorganic materials such as silicon oxide, silicon nitride, silicon oxynitride, or other suitable inorganic dielectric materials.

First active conductive pads 116 are formed at the bottom surface of the semiconductor package 100. In some embodiments, the active conductive pads 116 are referred to as metal pads, although they may have the shapes (such as pillars or posts) other than pads. The first active conductive pads 116 (which may be parts of the respective active RDLs 104) may be formed of a metallic material such as copper, aluminum, nickel, palladium, gold, or an alloy thereof. In some embodiments, each of the first active conductive pads 116 includes a via portion 116a with smaller dimension and a trench portion 116b with larger dimension. In some embodiments, formation of the first active conductive pads 116 may be achieved by forming openings in the second dielectric layer 114, and filling the metallic material into the openings. In some embodiments, the trench portion 116b of the first active conductive pads 116 are bonded to a package component (not shown) e.g. a Printed Circuit Board (PCB), an interposer, or another type of package component through conductors such as bumps, solder balls, solder paste, or other suitable conductors.

In some embodiments, the semiconductor package 100 includes another set of active RDLs (e.g. back-side active RDLs) (not shown) formed in the dielectric layer(s) 108. Second active conductive pads 120 may be formed in the dielectric layer(s) 108. In some embodiments, the second active conductive pads 120 are in the topmost layer of the back-side active RDL. A third dielectric layer(s) 122 may be formed over the second active conductive pads 120 and the first dielectric layer(s) 108. The third dielectric layer 122 may be formed of a polymer such as PBO or other suitable organic or inorganic materials. In some embodiments, a protective layer 124 such as a tape is over and attached to the third dielectric layer 122 to provide protection and reinforcement to the underlying structure such as the third dielectric layer 122, the dielectric layer(s) 108, and the back-side RDLs. The semiconductor package 100 further includes active through insulation vias (active TIVs) 126, which are encapsulated in, and hence penetrate through, the insulative layer 106. The active TIVs 126 are electrically coupled/connected to the active RDLs 104 and the back-side active RDLs (not shown), as well as the semiconductor die 102. In some embodiments, the material of the active TIVs 126 includes copper, aluminum or the like.

The semiconductor package 200 is bonded to the semiconductor package 100 through, for example, interconnection features 206. In some embodiments, the interconnection features 206 include solder bumps, solder balls or other suitable conductive features. An underfill 208 may be between the interconnection features 206 to avoid short-circuitry. The semiconductor package 200 includes semiconductor die(s) (second semiconductor device(s)) 204 bonded to a substrate (e.g. a package substrate) 202. In some embodiments, the semiconductor die 204 includes a memory such as a DRAM device, or an SRAM device. The exact functionality of the semiconductor die 204 is not a limitation to the provided subject matter. The substrate 202 may include third active conductive pads 214 and fourth active conductive pads 216 respectively in two opposite surfaces of the substrate 202, and another set of active RDLs (not shown) may be electrically connected between the third active conductive pads 214 and the fourth active conductive pads 216. The bonding of semiconductor die 204 to the substrate 202 may be achieved through wire bonding, flip-chip bonding, or the like. The third active conductive pad 214 or the fourth active conductive pad 216 may be configured as a connection feature external or internal to the semiconductor device 204. In some embodiments, the interconnection features 206 are in contact with the fourth active conductive pads 216 at the bottom surface of the semiconductor package 200. Accordingly, the interconnection features 206 have their top surfaces in contact with the fourth active conductive pads 216 and bottom surfaces in contact with the second active conductive pads 120. The interconnection features 206 are configured to be electrically connected between the semiconductor die 102 and the semiconductor die 204.

The semiconductor package 200 further includes an insulative layer(s) 210 and a conductive feature(s) 212. The insulative layer 210 surrounds the semiconductor die 204, and has a first surface 210a and a second surface 210b opposite to each other. The first surface 210a is distal to the substrate 202, and the second surface 210b is proximal to the substrate 202. The conductive feature 212 is extended from the first surface 210a to a location that is proximal to the second surface 210b of the insulative layer 212. The conductive feature 212 has a first end 212a exposed by the first surface 210a of the insulative layer 210. In some embodiments, the conductive feature 212 is in a periphery of the semiconductor device 10, and between the semiconductor die 204 and a side surface 210c of the insulative layer 210. For example, the conductive feature 212 and the semiconductor die 204 are disposed side by side. At least two of the conductive feature 212, the semiconductor die 102 and the semiconductor die 204 may be misaligned in the stacking direction Z. In some embodiments, the conductive feature 212 and the semiconductor die 102 are misaligned in the stacking direction Z (i.e. they do not overlap each other in the stacking direction Z). In some embodiments, the conductive feature 212 and the semiconductor die 204 are misaligned in the stacking direction Z.

The shield 300 substantially covers the first surface 210a for shielding EMI. The shield 300 is grounded through the first end 212a of the conductive feature 212 exposed by the first surface 210a of the insulative layer 210. The shield 300 may further cover the side surface 210c of the insulative layer 210. The shield 300 may be a single-layer or multilayer structure. For example, the shield 300 is a multilayer coating of 0.1 um SUS (stainless steel)/5 um Cu/0.3 um SUS, but not limited thereto. In some embodiments, the shape of the shield 300 may be conformal to some external surfaces e.g. the first surface 210a of the insulative layer 104, but not limited thereto. The underfill 208 may further at least partially cover the side surface 210c of the insulative layer 210, and in such case, the underfill 208 is at least partially between the shield 300 and the side surface 210c. The conductive feature 212 may further have a second end 212b exposed by the second surface 210b of the insulative layer 210, and the second end 212b is configured to be connected with a ground terminal 134. The lateral side of the conductive feature 212 is substantially surrounded and protected by the insulative layer 210. In some embodiments, the conductive feature 212 penetrates through the insulative layer 210, i.e. the conductive feature 212 is a through insulation via (TIV). The conductive feature 212 may be substantially a column structure e.g. a cylindroid, or the like, and the dimension (e.g. width, length or diameter) of the conductive feature 212 ranges from about 100 um to about 200 um, but not limited thereto. In some embodiments, the height of the conductive feature 212 is substantially equal to the thickness of the insulative layer 210, and the first end 212a of the conductive feature 212 is leveled with the first surface 210a of the insulative layer 210, i.e. the first end 212a and the first surface 210a are substantially coplanar. The material of the conductive feature 212 includes copper, aluminum, or the like. The conductive feature 212 may be a monolithic structure or consists of several parts.

In some embodiments, the ground terminal 134 is in the semiconductor package 100 e.g. at the same level with and formed concurrently with the first active conductive pads 116. In some embodiments, the ground terminal 134 has via portion and trench portion as the first active conductive pads 116, and the ground terminal 134 and the first active conductive pads 116 may be concurrently formed. The conductive feature 212 can be electrically connected to the ground terminal 134 through dummy conductive structures disposed in the grounding path between the conductive feature 212 and the ground terminal 134. For example, the conductive structures includes a first dummy conductive pad(s) 218, a second dummy conductive pad(s) 220, dummy RDLs (not shown) connected between the first and second dummy conductive pads 218, 220, a third dummy conductive pad(s) 128, a dummy interconnection feature 222, a dummy TIV(s) 130, and dummy RDLs 132. The aforementioned dummy conductive structures may be formed concurrently with respective active components of the semiconductor packages 100, and 200.

The conductive feature 212 is configured to electrically couple/connect the shield 300 to the ground terminal 134, and hence is isolated from the semiconductor dies 102, and 204. The first dummy conductive pad(s) 218, the second dummy conductive pad(s) 220, the third dummy conductive pad(s) 128, the dummy interconnection feature 222, the dummy TIV(s) 130 and the dummy RDLs 132 may be all isolated from the semiconductor dies 102, and 204.

The structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 2A:
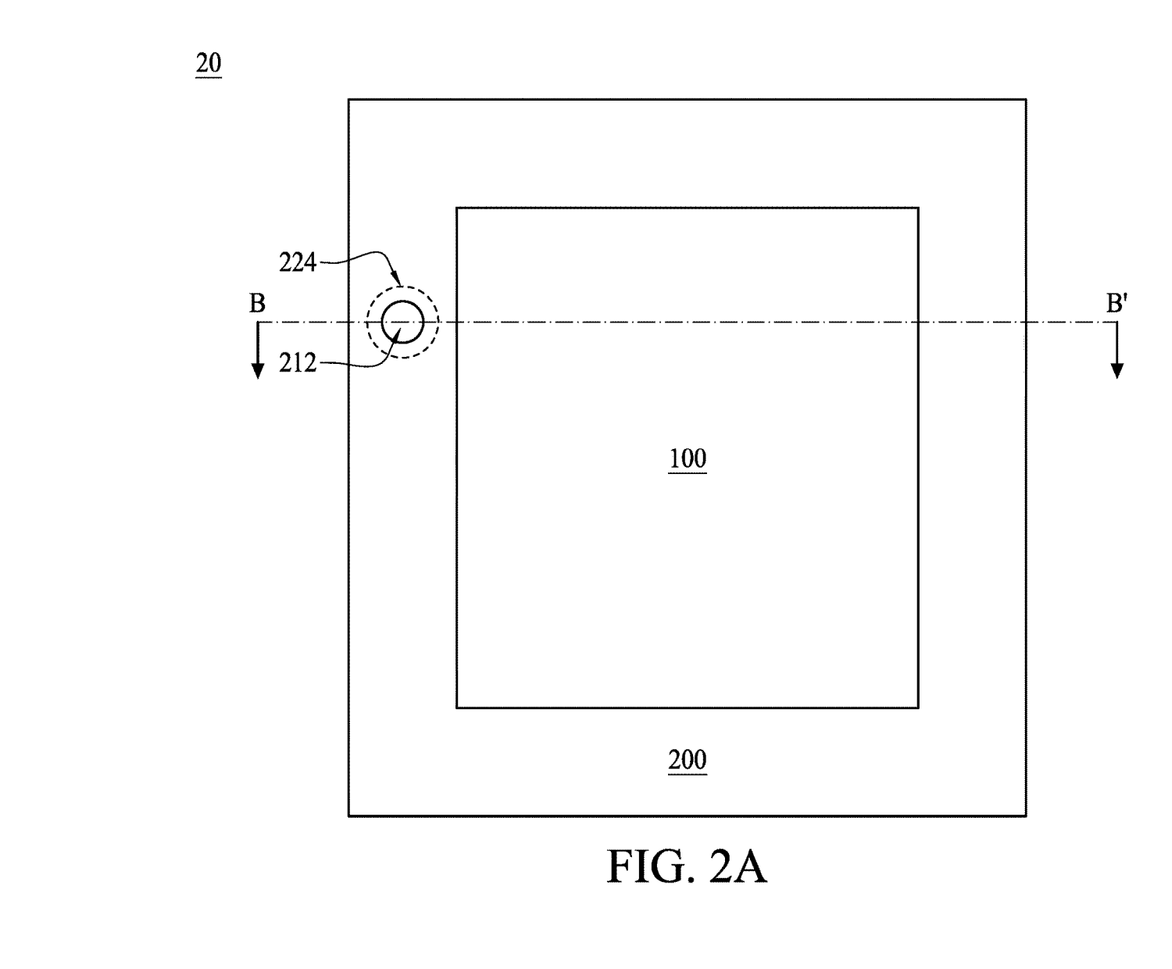
FIG. 2A is a top view of some alternative embodiments of an anti-EMI semiconductor device 20.
Figure 2B:
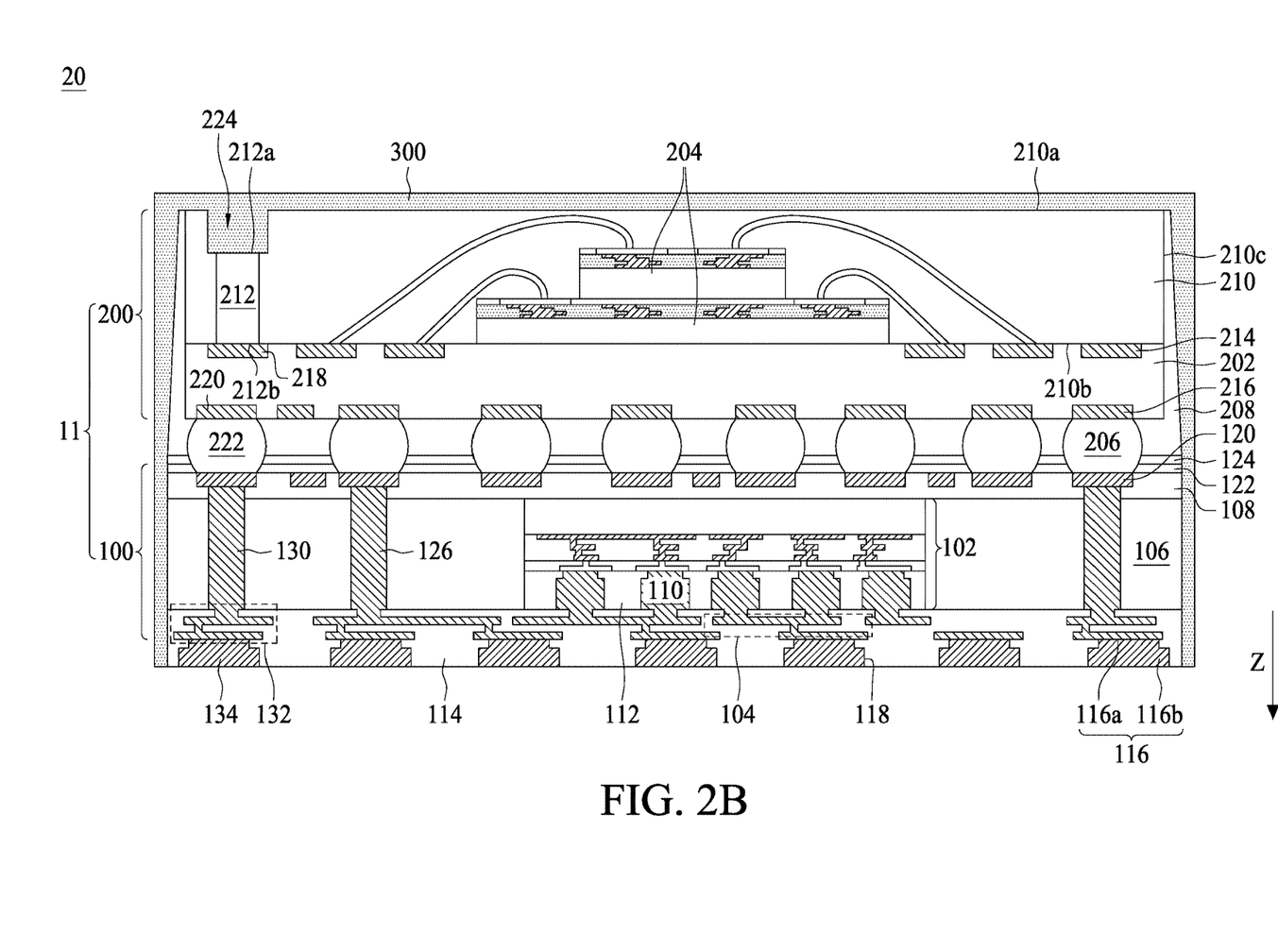
FIG. 2B is a cross-sectional view taken along a line B-B' in FIG. 2A.

FIG. 2A is a top view of some alternative embodiments of an anti-EMI semiconductor device 20, and FIG. 2B is a cross-sectional view taken along a line B-B' in FIG. 2A. As depicted in FIGS. 2A and 2B, one difference between the semiconductor device 20 and the semiconductor device 10 is that the height of the conductive feature 202 is smaller than the thickness of the insulative layer 210, thereby forming a recess 224 in the insulative layer 210 proximal to the first surface 210a. In some embodiments, the thickness of the recess 224 ranges from about 15 um to about 20 um. The shield 300 is in the recess 224 to be electrically connected to the conductive feature 212 through the first end 212a. Specifically, the electrical connection point of the shield 300 and the conductive feature 212 is between the shield 300 and the conductive feature 212 in the stacking direction Z. In some embodiments, the shield 300 is in physical, direct contact with the first end 212a. In some alternative embodiments, the shield 300 is in indirect contact with the first end 212a through a conductive interposer (not shown). The dimension of the recess 224 e.g. the width, length or diameter of the shield 300 in the recess 224 may be greater than the dimension of the conductive feature 212 e.g. the width, length or diameter of the first end 212a of the conductive feature 212. The conductive feature 212 is substantially a column structure e.g. a cylindroid, or the like. In some embodiments, the dimension (e.g. width, length or diameter) of the conductive feature 212 ranges from about 100um to about 200 um. In some embodiments, the dimension of the conductive feature 212 is about 10 um to 20 um greater than that of the conductive feature 212, e.g. the dimension of the conductive feature 212 ranges from about 110 um to about 220 um, but not limited thereto.

Figure 3A:
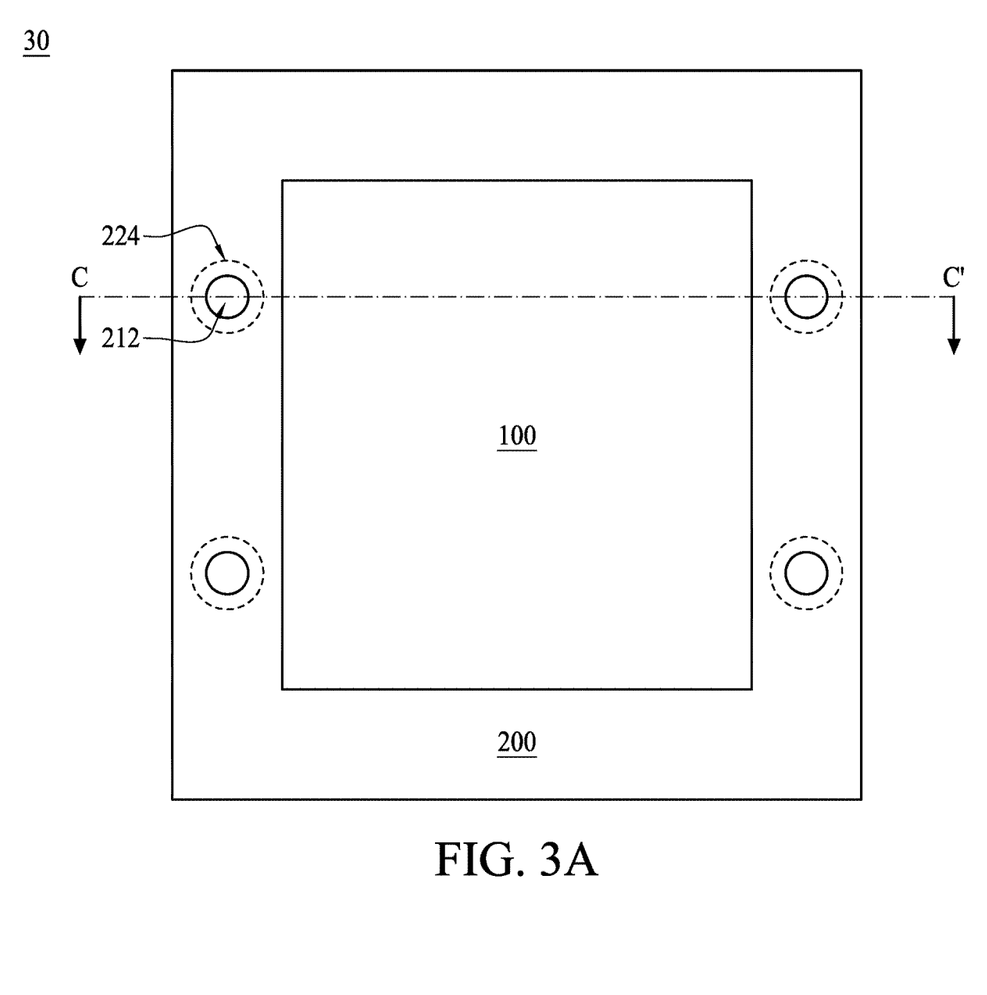
FIG. 3A is a top view of some alternative embodiments of an anti-EMI semiconductor device 30.
Figure 3B:
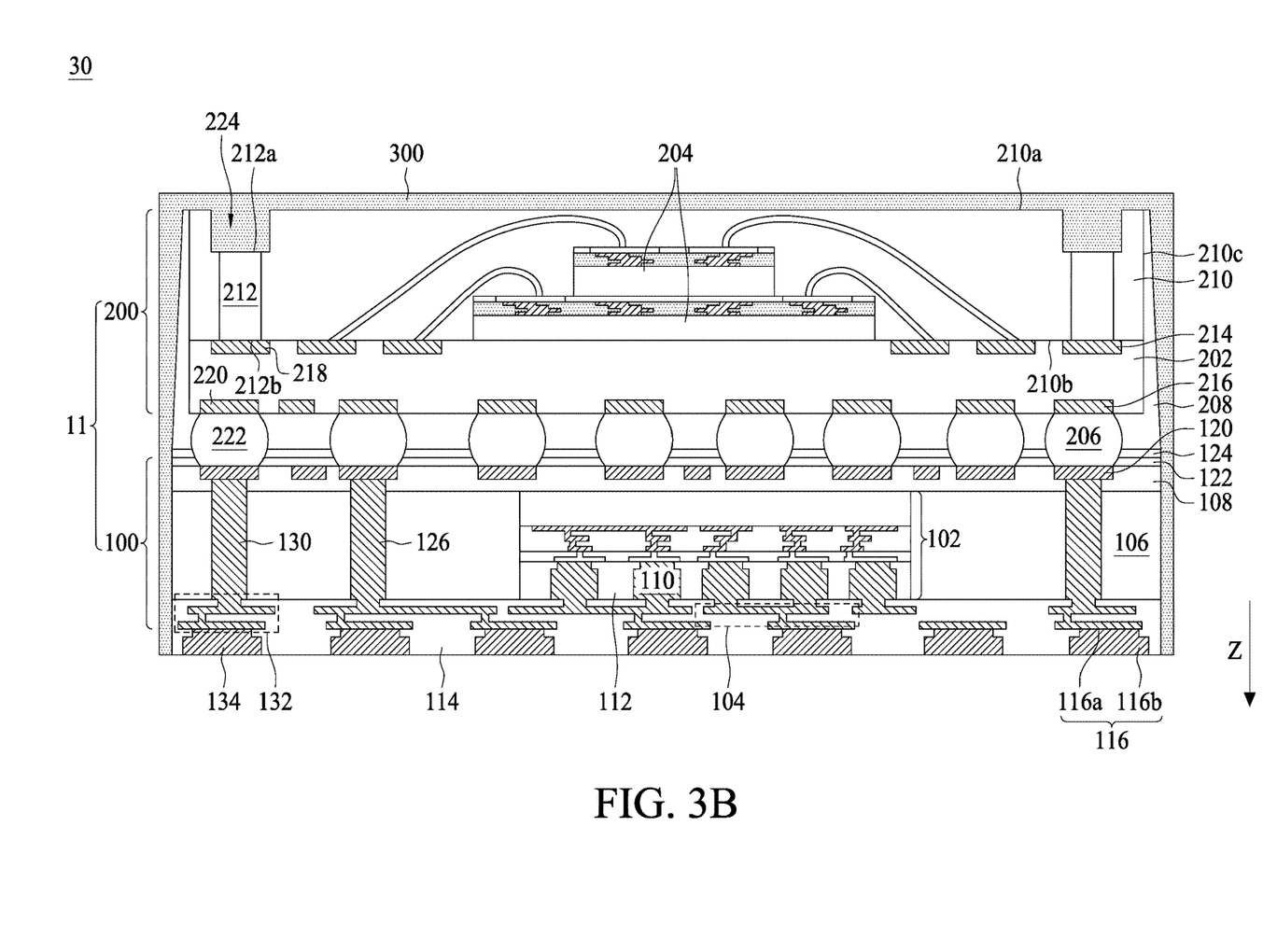
FIG. 3B is a cross-sectional view taken along a line C-C' in FIG. 3A.

FIG. 3A is a top view of some alternative embodiments of an anti-EMI semiconductor device 30, and FIG. 3B is a cross-sectional view taken along a line C-C' in FIG. 3A. As depicted in FIGS. 3A and 3B, one difference between the semiconductor device 30 and the semiconductor devices 10, and 20 is that the package 200 includes a plurality of conductive features 202 rather than one conductive feature 202. The shield 30 may be grounded through the first end 212a of each conductive feature 202.

Figure 4:
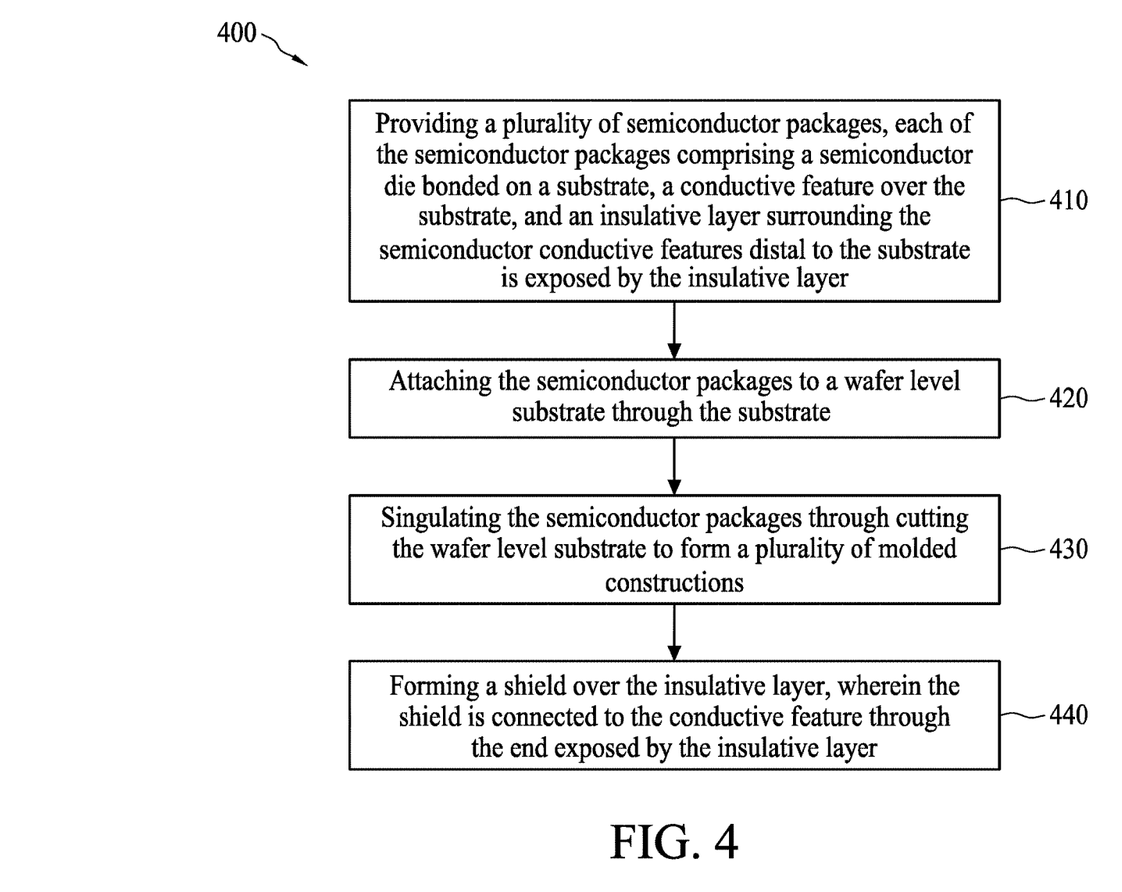
FIG. 4 is a flowchart of a method of manufacturing a semiconductor device according to various aspects of the present disclosure.

FIG. 4 is a flowchart of a method 400 of manufacturing a semiconductor device according to various aspects of the present disclosure. It is understood that additional operations can be provided before, during, and after the method 400, and some of the operations described can be replaced or eliminated for other embodiments of the method. The method 400 begins at operation 410 in which a plurality of semiconductor packages are provided. Each semiconductor package includes a semiconductor die bonded on a substrate, a conductive feature over the substrate, and an insulative layer surrounding the semiconductor die. One end of each conductive feature distal to the substrate is exposed by the insulative layer. The method 400 continues with operation 420 in which the semiconductor packages are attached to a wafer level substrate through the substrate. The method 400 continues with operation 430 in which the semiconductor packages are singulated through cutting the wafer level substrate to form a plurality of molded constructions. The method 400 continues with operation 440 in which a shield is formed over the insulative layer. The shield is connected to the conductive feature through the end exposed by the insulative layer.

Figure 5A:
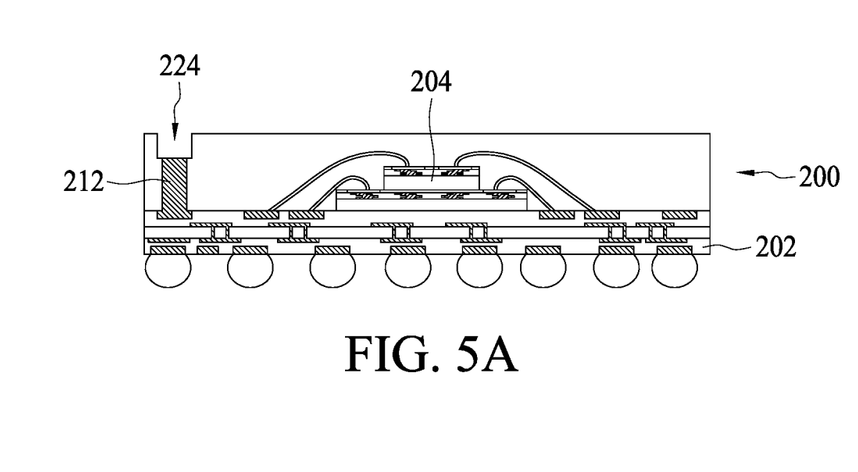
FIGS. 5A, 5B, 5C and 5D are cross-sectional views at one of various operations of manufacturing a semiconductor device according to some embodiments.

FIGS. 5A, 5B, 5C and 5D are cross-sectional views at one of various operations of manufacturing a semiconductor device according to some embodiments. As depicted in FIG. 5A and operation 410 in FIG. 4, the method 400 begins at operation 410 in which a plurality of semiconductor packages 200 are provided. Each semiconductor package 200 includes a semiconductor die 204 bonded on a substrate (e.g. a package substrate 202), a conductive feature 212 over the substrate, and an insulative layer 210 surrounding the semiconductor die 204. One end of the conductive features 212 distal to the substrate is exposed by the insulative layer 210. The conductive features 212 may be formed prior to or subsequent to formation of the insulative layer 212. In some embodiments, the insulative layer 210 covers the conductive features 212, and is then partially removed by e.g. laser drill, etching or other operation to form a recess 224 in the insulative layer 212 to expose the end of the conductive feature 212.

Figure 5B:
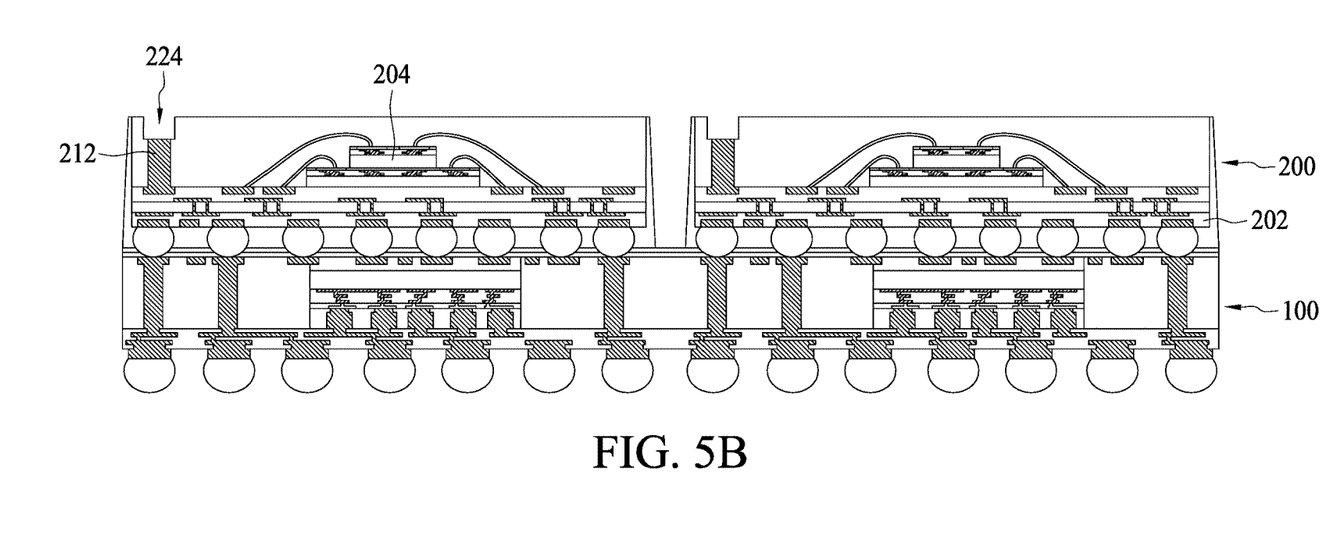
Figure 5C:
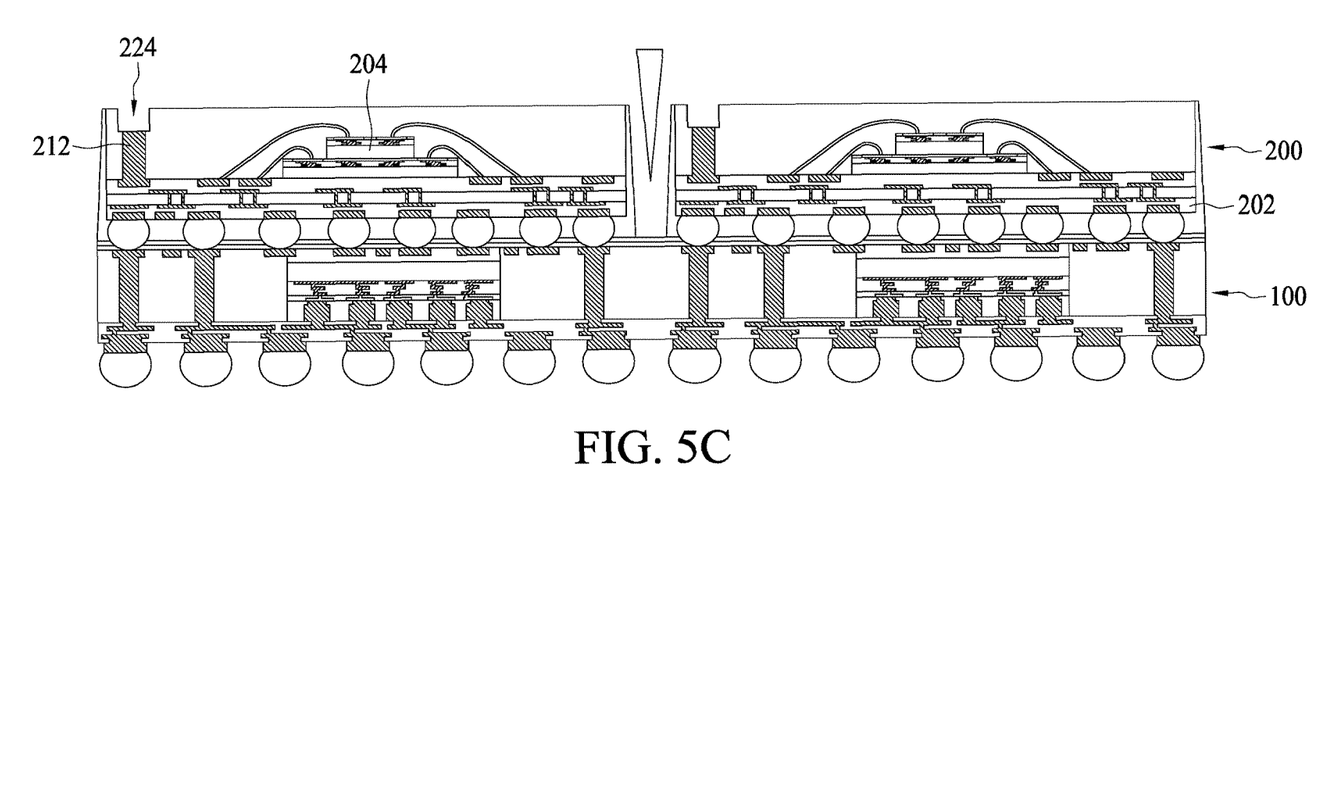
Figure 5D:
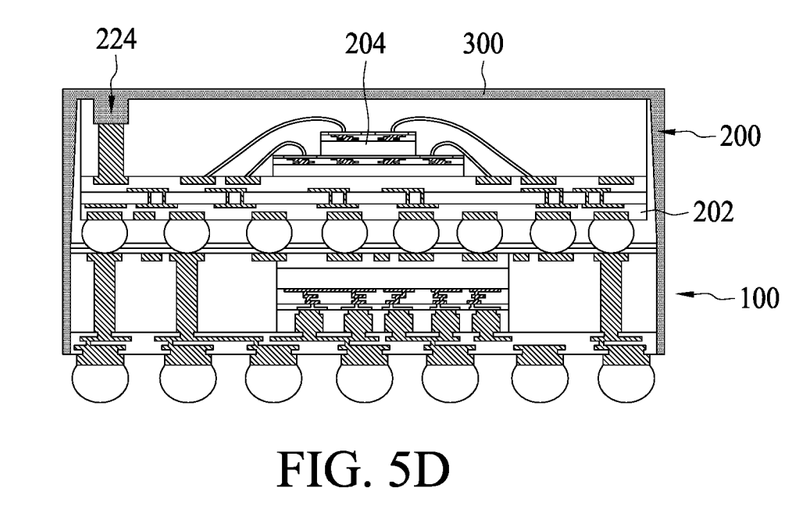

As depicted in FIG. 5B and operation 420 in FIG. 4, the method 400 continues with operation 420 in which the semiconductor packages 200 are attached to a wafer level substrate through the substrate. In some embodiments, the wafer level substrate includes a plurality of semiconductor packages 100, which are prior to singulation and are connected together. In some embodiments, the conductive feature 212 is visible and used as an align mark during attaching operation. As depicted in FIG. 5C and operation 430 in FIG. 4, the method 400 continues with operation 430 in which the semiconductor packages 200 are singulated through cutting the wafer level substrate to form a plurality of molded constructions. As depicted in FIG. 5D and operation 440 in FIG. 4, the method 400 continues with operation 440 in which a shield 300 is formed over the insulative layer 210. The shield 210 is connected to the conductive feature 212 through the end exposed by the insulative layer 210. The shield 300 is in the recess 224 to be connected to the end of the conductive feature 212. In some embodiments, the shield 300 is in contact with the end of the conductive feature. In some alternative embodiments, the shield 300 is in indirect contact with the end through a conductive interposer.

In the present disclosure, the shield is grounded to the ground terminal through the conductive feature surrounded and protected by the insulative layer, which can improve reliability. The conductive structures configured as grounding path may be manufactured concurrently with the components of the semiconductor device, and thus no extra operation are required.

One of the broader forms of the present disclosure involves a semiconductor device. The semiconductor device comprises a semiconductor die; an insulative layer surrounding the semiconductor die, wherein the insulative layer has a first surface and a second surface opposite to each other; a conductive feature extended from the first surface to be proximal to the second surface of the insulative layer, wherein the conductive feature has a first end exposed by the first surface of the insulative layer; and a shield covering the first surface of the insulative layer and grounded through the first end of the conductive feature exposed by the first surface of the insulative layer.

Another of the broader forms of the present disclosure involves a 3D (three dimensional) semiconductor package. The 3D semiconductor package comprises a molded construction comprising a first semiconductor die and a second semiconductor die stacked in a stacking direction; an interconnection feature connected between the first semiconductor die and the second semiconductor die; an insulative layer surrounding the second semiconductor die; and a conductive feature surrounded by the insulative layer, wherein the conductive feature is extended along the stacking direction; and an EMI (Electromagnetic Interference) shield covering an external surface of the molded construction and being electrically connected with the conductive feature, wherein an electrical connection point of the EMI shield and the conductive feature is between the EMI shield and the conductive feature in the stacking direction.

Still another one of the broader forms of the present disclosure involves a method of manufacturing a semiconductor device. The method comprises providing a plurality of semiconductor packages, each of the semiconductor packages comprising a semiconductor die bonded on a substrate, a conductive feature over the substrate, and an insulative layer surrounding the semiconductor die, wherein an end of each of the conductive features distal to the substrate is exposed by the insulative layer; attaching the semiconductor packages to a wafer level substrate through the substrate; singulating the semiconductor packages through cutting the wafer level substrate to form a plurality of molded constructions; and forming a shield over the insulative layer, wherein the shield is connected to the conductive feature through the end exposed by the insulative layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a first semiconductor die on a bottommost surface of the substrate;
a second semiconductor die on a topmost surface of the substrate, wherein the substrate is between the first semiconductor die and the second semiconductor die;
an interconnection feature between the substrate and the first semiconductor die and electrically connected to the first semiconductor die and the second semiconductor die;
an insulative layer surrounding the second semiconductor die, wherein the insulative layer has a first surface and a second surface opposite to each other, the first surface is a topmost surface of the insulative layer, and the second surface is a bottommost surface of the insulative layer;
a conductive feature extended from the first surface to be proximal to the second surface of the insulative layer, wherein the conductive feature has a first end exposed from a recess of the first surface of the insulative layer, and the first end of the conductive feature is lower than the topmost surface of the insulative layer, and proximal to the topmost surface of the insulative layer than to the bottommost surface of the insulative layer along a thickness direction of the insulative layer; and
a shield covering the first surface of the insulative layer and grounded through the first end of the conductive feature exposed from the first surface of the insulative layer,
wherein an uppermost surface of a portion of the shield is extended across the entire recess of the insulative layer.

2. The semiconductor device of claim 1, wherein the conductive feature has a second end exposed from the second surface of the insulative layer, and the second end is configured to be connected with a ground terminal.

3. The semiconductor device of claim 1, wherein a height of the conductive feature is smaller than a thickness of the insulative layer along the thickness direction, and the shield is electrically connected to the conductive feature through the first end of the conductive feature.

4. The semiconductor device of claim 1, wherein the substrate is disposed between the first semiconductor die and the second semiconductor die with respect to a vertical stack.

5. The semiconductor device of claim 1, further comprising a second insulative layer surrounding the first semiconductor die.

6. The semiconductor device of claim 1, wherein the conductive feature is a through insulation via (TIV).

7. The semiconductor device of claim 1, wherein the conductive feature is isolated from the second semiconductor die.

8. The semiconductor device of claim 1, wherein the insulative layer further has a side surface, and the shield further covers the side surface of the insulative layer.

9. The semiconductor device of claim 8, wherein the conductive feature is in a periphery of the semiconductor device, and between the second semiconductor die and the side surface of the insulative layer.

10. The semiconductor device of claim 1, wherein the insulative layer includes a multilayer structure.

11. The semiconductor device of claim 1, further comprising another conductive feature extended from the first surface to be proximal to the second surface of the insulative layer, and electrically connected to the shield.

12. The semiconductor device of claim 1, wherein second semiconductor die is bonded on the substrate.

13. The semiconductor device of claim 12, further comprising a plurality of active pads disposed on the topmost surface of the substrate, wherein the second semiconductor die is electrically connected to the plurality of active pads.

14. The semiconductor device of claim 1, wherein the conductive feature is misaligned with at least one of the first semiconductor die and the second semiconductor die with respect to a vertical stack.

15. A semiconductor device, comprising:
a substrate;
a first semiconductor die on a surface of the substrate;
a second semiconductor die on another surface of the substrate, wherein the substrate is disposed between the first semiconductor die and the second semiconductor die with respect to a vertical stack;
an insulative layer surrounding the second semiconductor die, wherein the insulative layer has a first surface, a second surface opposite to each other and a recess recessed from the first surface, the first surface is a topmost surface of the insulative layer, and the second surface is a bottommost surface of the insulative layer;
a conductive feature having an edge surrounded by the insulative layer, wherein the conductive feature has a first end exposed from the recess and a second end exposed from the second surface of the insulative layer, the first end of the conductive feature is proximal to the topmost surface than to the bottommost surface along a thickness direction of the insulative layer; and
a shield covering the first surface of the insulative layer and filling the entire recess, wherein the shield is grounded through the first end of the conductive feature exposed from the recess of the insulative layer, and an entire width of the recess measured along a direction substantially parallel to the first surface is larger than an entire width of the conductive feature measured along the direction.

16. The semiconductor device of claim 15, further comprising a connection feature disposed on the second surface of the insulative layer and connected to the second semiconductor die, and the connection feature is configured as an electrical connection external or internal to the semiconductor device.

17. A semiconductor device, comprising:
a first redistribution layer (RDL) comprising a first active conductive structure and a first dummy conductive structure electrically disconnected from each other;
a first semiconductor die over the first RDL and electrically connected to the first active conductive structure;
a second semiconductor die stacked on the first semiconductor die;
a second RDL between the first semiconductor die and the second semiconductor die, wherein the second RDL comprises a second active conductive structure and a second dummy conductive structure, wherein the second semiconductor die is electrically connected to the first semiconductor die through the second active conductive structure and the first active conductive structure;
an insulative layer surrounding the second semiconductor die, wherein the insulative layer has a first surface, a second surface opposite to each other, a side surface, and a recess recessed from the first surface, the first surface is a topmost surface of the insulative layer, and the second surface is a bottommost surface of the insulative layer;
a conductive feature having an edge surrounded by the insulative layer, wherein the conductive feature has a first end exposed from the recess, the first end of the conductive feature is proximal to the topmost surface than to the bottommost surface along a thickness direction of the insulative layer, and the conductive feature is electrically connected to the first dummy conductive structure through the second dummy conductive structure; and
a shield covering the first surface and the side surface of the insulative layer and in the recess, wherein the shield is grounded through the first end of the conductive feature exposed from the recess of the insulative layer, and the recess is entirely filled with the shield.

18. The semiconductor device of claim 17, wherein a dimension of the recess is greater than that of the conductive feature.

19. The semiconductor device of claim 17, further comprising a second insulative layer surrounding the first semiconductor die.

20. The semiconductor device of claim 19, wherein the second insulative layer further has a side surface, and the shield further covers the side surface of the second insulative layer.

* * * * *